United States Patent [19]

Greenstein et al.

[11] 3,726,002

[45] Apr. 10, 1973

[54] PROCESS FOR FORMING A MULTI-LAYER GLASS-METAL MODULE ADAPTABLE FOR INTEGRAL MOUNTING TO A DISSIMILAR REFRACTORY SUBSTRATE

[75] Inventors: Bernard Greenstein, Toledo, Ohio; Perry Robert Langston, Jr., Poughkeepsie, N.Y.; Bernt Narken, Poughkeepsie, N.Y.; Melvin Norris Turetzky, Poughkeepsie, N.Y.

[73] Assignee: International Business Machines Corporation, Armonk, N.Y.

[22] Filed: Aug. 27, 1971

[21] Appl. No.: 175,530

[52] U.S. Cl. ....................29/577, 65/59, 29/625

[51] Int. Cl. ....................B01j 17/00

[58] Field of Search ....................29/577, 625; 65/59, 65/60

[56] References Cited

UNITED STATES PATENTS

| | | | |
|---|---|---|---|
| 2,038,627 | 4/1936 | Badger | 65/32 |
| 3,311,966 | 4/1967 | Shaheen et al. | 29/625 |
| 3,509,624 | 5/1970 | Boucher | 29/577 |

OTHER PUBLICATIONS

NASA, Technical Note, D–5320, "A Fabrication Process for Glass Coated Electron – Bombardment Ion Thruster Grids," by Bruce A. Banks.

*Primary Examiner*—Richard J. Herbst
*Assistant Examiner*—W. Tupman
*Attorney*—Kenneth R. Stevens et al.

[57] ABSTRACT

A process for fabricating a high performance electrical interconnection package for a plurality of semiconductor chips including the steps of selecting an appropriate dissimilar refractory substrate, forming a plurality of bubble-free layers of glass over the substrate, depositing a plurality of planar metallization patterns on each layer of deposited glass, selectively depositing vertical studs for electrical interconnection between various conductive patterns, and bonding a plurality of integrated circuit chips to the upper surface of the glass package.

7 Claims, 6 Drawing Figures

INVENTORS
BERNARD GREENSTEIN
PERRY R. LANGSTON, JR.
BERNT NARKEN
MELVIN N. TURETZKY

BY Kenneth R. Stevens
ATTORNEY

PROCESS FOR FORMING A MULTI-LAYER GLASS-METAL MODULE ADAPTABLE FOR INTEGRAL MOUNTING TO A DISSIMILAR REFRACTORY SUBSTRATE

BACKGROUND OF THE INVENTION

1. Field of the Invention

This invention relates to semiconductor packages and more particularly to a multi-layer glass-metal package suitable for integral mounting on a dissimilar refractory substrate.

2. Related Applications

U.S. Applications, Serial Nos. 175,536 (Johnson et al.) and 175,529 (Langston et al.), assigned to the assignee of the present application and filed on Aug. 27, 1971, set forth distinct inventions connected with the overall glass-metal package.

BRIEF DESCRIPTION OF THE PRIOR ART

As the integrated circuit technology advances towards large-scale integration and high performance circuits, it is necessary to provide interconnection electrical packaging which is compatible with the performance demands of the associated circuitry. Thus, the problems of signal delay, package impedance, and cross-talk are extremely critical. Known prior art packaging materials often do not possess appropriate controllable dielectric properties to accommodate high performance circuits in large-scale integration schemes.

A high quality glass-metal package offers one solution to the problem. By simply changing the specific glass composition, the various desired range of properties are readily controllable and selectable. It has relatively high strength, and its chemically inert and thermally stable properties are extremely adaptable for known upper surface chip bonding techniques.

Despite the desirability of employing glass as the dielectric insulating layer in multi-layer interconnection packages, known processes for fabricating a multi-level package are almost non-existent or result in such poor quality products that the advantages attributable to certain dielectric properties of the selected glass are defeated.

Generally, one basic problem in forming multi-level glass layers is traced to the formation of bubbles occurring during the firing step. One type of bubble results from the decomposition of organic materials present on the surface upon which the glass layer is being deposited. This decomposition causes evolution of gases that are trapped or absorbed by the upper glass layer. The consequence of this type of bubble formation is to create voids in the glass structure. During subsequent metal evaporation steps, these voids or openings often cause electrical shorting due to metallization forming in the voids or openings. Also, the voids trap extraneous material so as to further aggrevate the contamination problem. Even if the bubble remains intact or does not break in the glass, its presence often destroys the planarity of the upper glass surface so as to impair subsequent processing operations, such as the photolithographic steps.

A second type of bubble or closed cell structure also creates problems in the formation of multi-layer glass modules. The gaseous ambient surrounding the glass during the firing step forms bubbles in the glass layer. A closed cell or bubble is formed as the glass layer enters the sintering phase. Sintering is that point at which the solid glass particles start to soften under the exposure to heat, and begin to join or coalesce with adjacent particles. At the sintering temperature, the glass is not capable of reflowing into a homogenius body without the formation of bubbles. As adjacent solid glass particles (having random geometrical shapes) begin to join, a closed cavity is formed. Stated in another way, necks are grown between two adjacent glass particles, and then the necks continue to grow between other pairs of particles, and thus ultimately, between all particles. At this point, an interconnected network of sintered glass particles are formed with voids throughout the network. The existence of this network prevents the fabrication of high quality multi-layer glass-metal modules having the desired impedance and planarity characteristics.

The prior art in the general glass area has suggested that bubble-free glass layers can be formed by outdiffusing the bubbles at a very high temperature. Often, this outdiffusion occurs in different gaseous ambients. However, this approach is totally unsuitable for the present multi-layer glass-metal modules, because the relatively high temperatures required to outwardly diffuse the trapped bubbles in the glass layer would completely destroy and disrupt previously deposited metallization lines and vertical metallic interconnection studs existing within the glass body.

A high quality bubble-free structure is also theoretically achievable by firing the glass in a complete vacuum. However, this approach causes a considerable number of practical problems, particularly in large-scale manufacturing operations due to the unfeasibility of working in this ambient.

Sputtering of successive glass layers to form a multi-level glass-metal package is another possible approach. However, this technique gives rise to significant disadvantages from a process and structural standpoint. Firstly, the sputtering process does not lend itself to the practical fabrication of glass layers of any appreciable thickness, which are sometimes necessary in order to obtain the desired impedance characteristics for the particular package designed. Further, it is not workable to build up a plurality of glass layers having interposed metallization patterns, and yet maintain each of the individual metallization patterns in a single plane.

SUMMARY OF THE INVENTION

It is therefore an object of the present invention to provide a high quality bubble-free glass electrical interconnection package.

Another object of the present invention is to provide electrical interconnection for a plurality of integrated circuit semiconductor chips through a solid glass body having a plurality of separated metallization patterns, each lying in a single plane, wherein the glass body is integrally and electrically attachable to a dissimilar refractory substrate having suitable mechanical and thermal cycling properties with respect to the glass body.

Another object of the present invention is to provide a bubble-free glass-metal interconnection package which can be fabricated at temperatures incapable of disrupting underlying metallized patterns and vertical interconnecting studs.

Another object of the present invention is to provide an integrated circuit interconnection package wherein the dielectric properties of the package are closely controllable by critical tolerance regulation of the glass layer thicknesses.

A further object of the present invention is to provide a solid glass package having any number of desired conductive metallized patterns, each located in a planar surface.

A further object of the present invention is to provide a glass-metal package which avoids the disadvantages associated with glass sputtering techniques.

Another object of the present invention is to provide a glass package having any number of metallized patterns located in planar surfaces wherein the line pattern dimensions can be exactingly controlled down to 1 mil lines with spacings of 2 mils, center to center.

An object of the present invention is to provide a glass-metal package adaptable for integral mounting on a substrate without cracking the glass-metal package.

An additional object of the present invention is to provide a multi-layer glass-metal interconnection package having any number of desired layers of metallized patterns, while maintaining the integrity of the glass dielectric properties and the multi-levels of metallization.

A further object of the present invention is to provide a solid glass electrical interconnection package which can be integrally mounted to a dissimilar multilevel interconnection refractory substrate. The refractory substrate is advantageously adaptable for external connection via pins located at substantially right angles to the major planar surfaces of the refractory substrate so as to facilitate electrical conduction between the outside world and a plurality of integrated circuit chips located on the upper surface of the glass body via the refractory substrate and the glass package.

In accordance with the aforementioned objects, the present invention provides a plurality of steps for fabricating a high performance complex wiring interconnection package including the steps of selecting an appropriate dissimilar refractory substrate, forming a plurality of bubble-free layers of glass over the substrate, depositing a plurality of planar metallization patterns on each layer of deposited glass, selectively depositing vertical studs for electrical interconnection between various conductive patterns, and bonding a plurality of integrated circuit chips to the upper surface of the glass package.

DESCRIPTION OF THE PREFERRED EMBODIMENTS

Figures 1, 2:
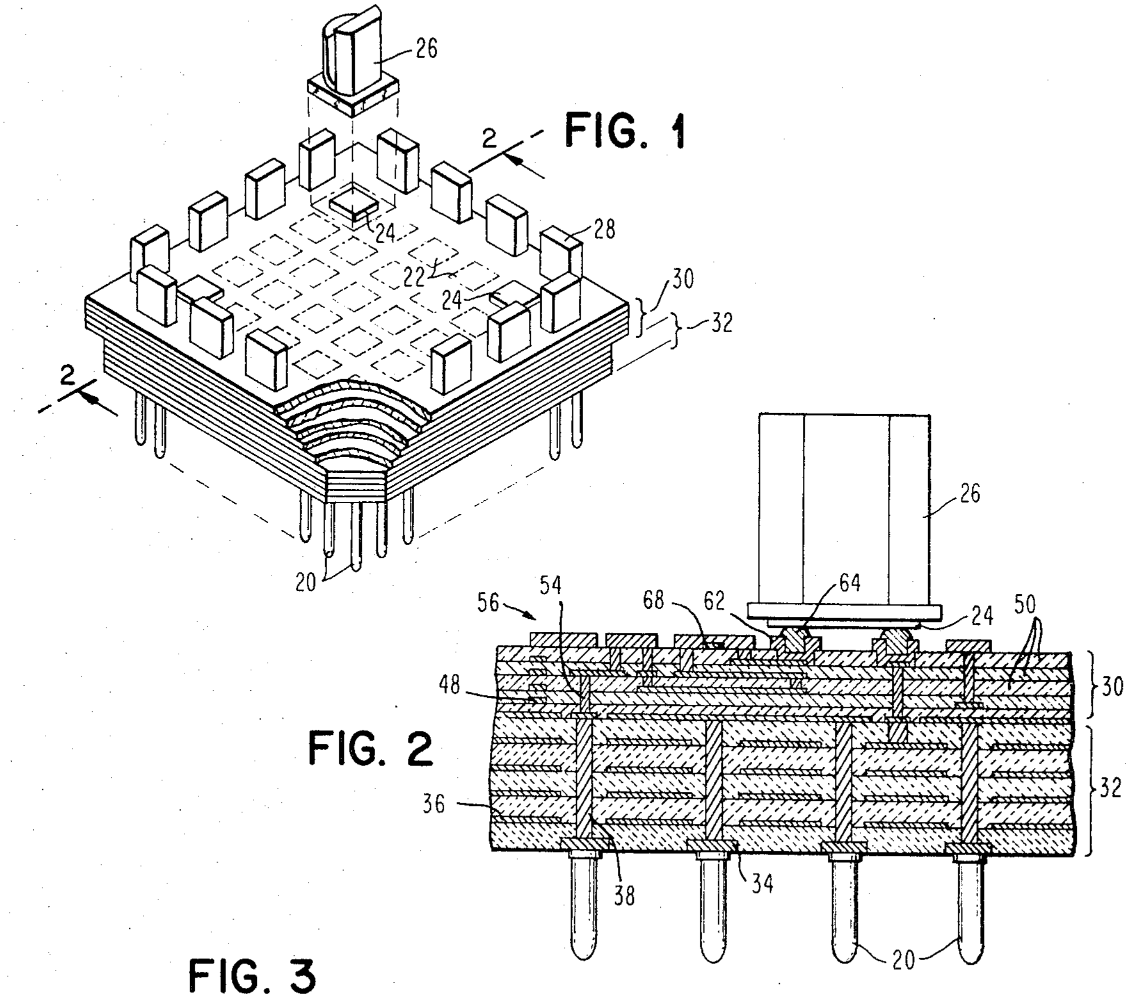
FIG. 1 illustrates a semiconductor integrated circuit package for interconnecting a plurality of semiconductor chips on a single substrate, and the perspective view is partially broken away to illustrate the manner in which the glass metal portion is constructed.
FIG. 2 is a partial cross-sectional view taken along lines 2—2, and more specifically illustrates the multilevels of interconnection for the package.
Figure 3:
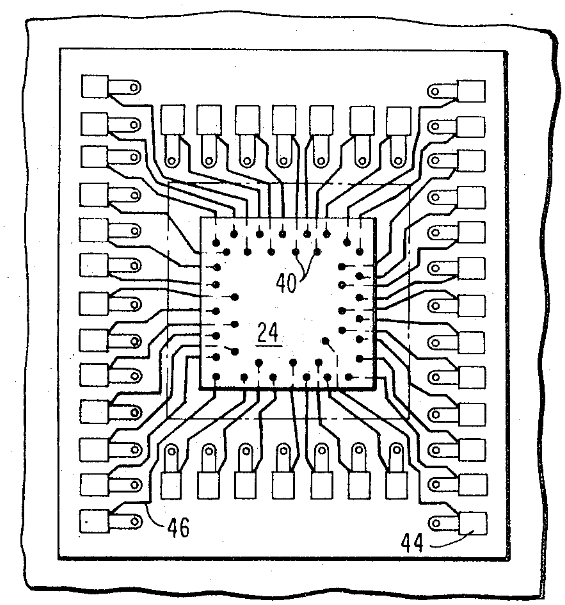
FIG. 3 is an enlarged plan view of a single chip site shown generally in FIG. 1, and illustrates the manner of interconnecting a particular chip to its upper surface metallurgy.

Now referring to FIGS. 1, 2 and 3, they illustrate the structural details of the complex interconnection structure necessary to communicate from the outside world via a plurality of pins 20 to a plurality of chip sites 22. A plurality of chips 24 having integrally attached grooved heat sinks 26 populate each chip site 22. Components, such as capacitors 28, are readily mounted at the periphery of the package. The interconnection metallurgy, shown more specifically in FIG. 2, also establishes voltage distribution planes, ground planes, X–Y signal planes, and voltage redistribution planes.

In this preferred embodiment, a glass-metal package 30 is joined to a multi-layer ceramic base 32. A plurality of pads 34 located on the under surface of the multi-layer ceramic base member 32 each connect to the pins 20. In the preferred embodiment, the pads 34 comprise a nickel plated tungsten metal, which are then joined to the pins 20 by brazing.

The multi-layer ceramic base member 32 includes a multi-level metallization generally indicated at 36 at a plurality of planes. Further vertical conductive paths through the multi-layer ceramic base member 32 are provided by a plurality of metal-filled vias 38. The base member 32 electrically functions to provide input-output connections to the pins 20, and to provide voltage distribution planes. The number of voltage distribution planes are governed by the voltage requirements of the circuit logic family existing at the chip level.

Also, the base member 32 contains redistribution planes. Redistribution planes provide an interconnection translation which is necessary because the pins 20 communicating with the external world constitute a larger size grid than the grid existing at the semiconductor chip level, as represented by the plurality of pads schematically shown at 40 in FIG. 3. Also, FIG. 3 illustrates the ease with which interconnections are made from a plurality of pads 44, located on the upper surface of the glass-metal module 30, to the plurality of conductive lines 46. Lines 46 are formed by metal deposition steps, but upper surface connections can further be implemented by wire bonding, thermal compression bonding, etc.

The glass-metal module 30 comprises metallurgy generally shown at 48 located at multi-levels or planes separated by a plurality of insulating glass layers 50. Vertical interconnections between different levels and the multi-layer ceramic substrate 32 are provided by a plurality of studs 54.

In FIG. 2, the top level metallurgy is generally designated by numeral 56. Top level metallurgy 56 schematically corresponds to the pads and conductive lines shown in FIG. 3 as elements 44 and 46, respectively. The semiconductor chips 24 are joined to predetermined conductive paths by a metallurgical system and solder connection illustrated at 62 and 64, respectively.

In order to allow for engineering changes, the top level metallurgy 56 is provided with engineering change pads 68. Basically, the engineering change pads 68 comprise a material which is softer than the metallurgy 56 itself. Accordingly, severing pressure applied on the upper surface of the metallurgy 56 in the area of the pad 68 breaks the metal line. Re-routes or engineering changes are then available by making other connection, for example, wire bonding. Only one engineering change pad 68 is illustrated; however, in actual practice, numerous pads would be located throughout the upper layer metallurgy. Pads 68 may be formed of a material such as a polyimide polymer which would cushion any severing forces, thus preventing damage to the upper glass layer surface, but their existence is not absolutely required in all instances.

Figure 5:
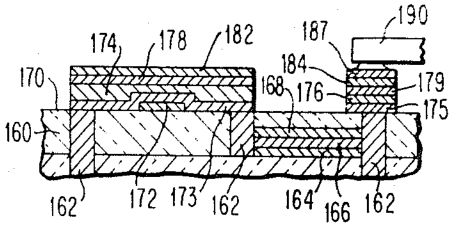
FIG. 5 is a cross-sectional view illustrating another embodiment of the upper or top level metallurgy.

As more specifically described with reference to FIG. 5, alternative techniques exist for customizing the upper layer metallization in order to readily affect deletions and engineering changes. FIG. 5 specifically illustrates a chromeless delete scheme, but simple mechanical or laser cutting approaches are equally suitable.

The resulting overall package is intended to operate in a suitable cooling environment as determined by the number of chips, electrical power requirements, and the heat transfer characteristics of the individual test sinks 26 joined to their respective chips 24.

In the preferred embodiment, the glass metal module 30 contains an X and a Y signal plane, a redistribution plane, a voltage distribution plane, and a top level interconnection and engineering change plane.

In order to achieve maximum utilization and efficiency of a single planar surface, X and Y planes are employed. That is, in one orthogonal plane, substantially all of the metallurgy is deposited in one direction and in the other orthogonal plane, the metallurgy is deposited in a direction at right angles to that of its related plane.

Figure 4A:
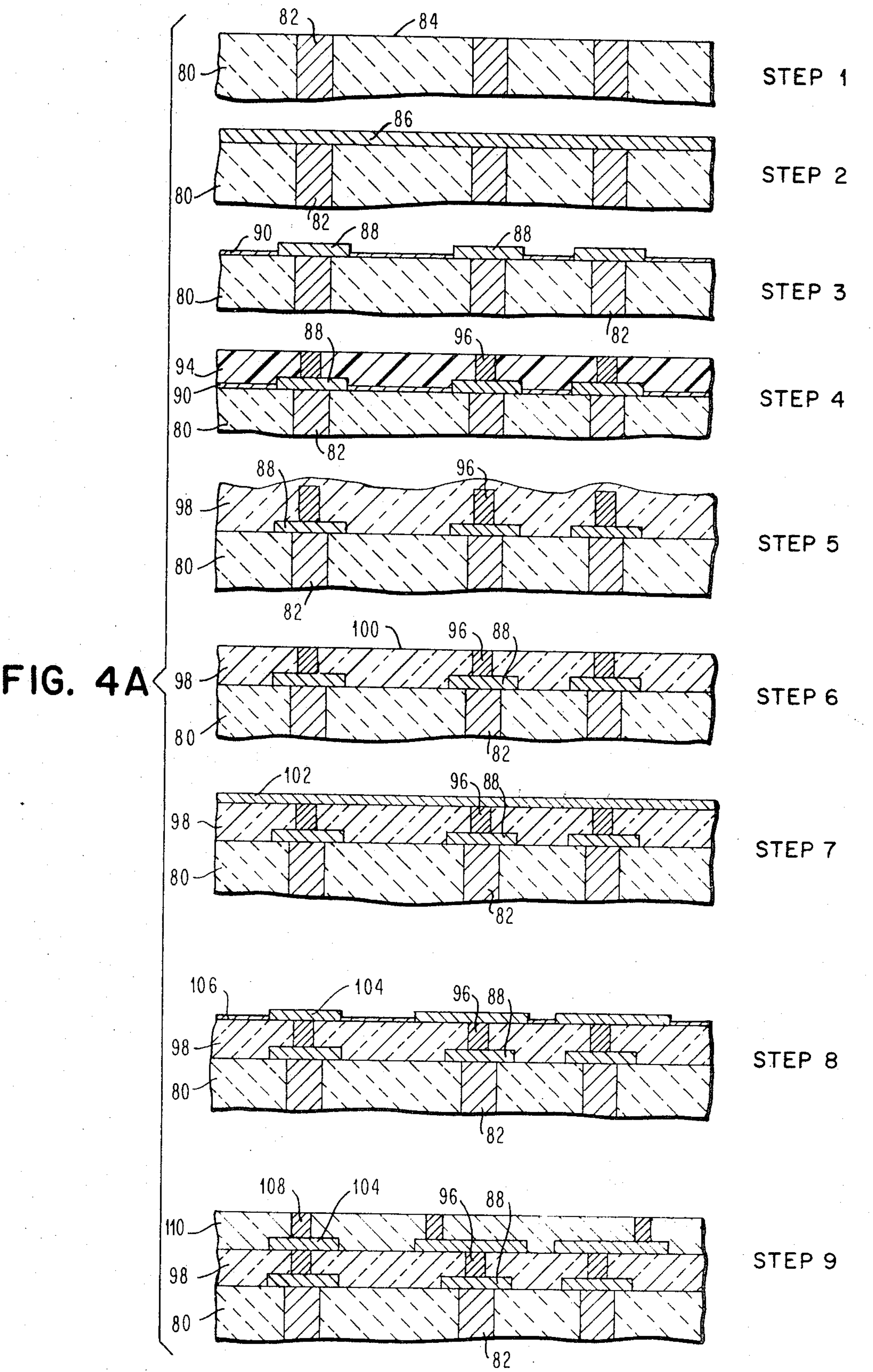
FIGS. 4A and 4B are schematic step-by-step cross-sectional views illustrating a preferred embodiment for fabricating the glass-metal portion of the overall interconnection package.
Figure 4B:
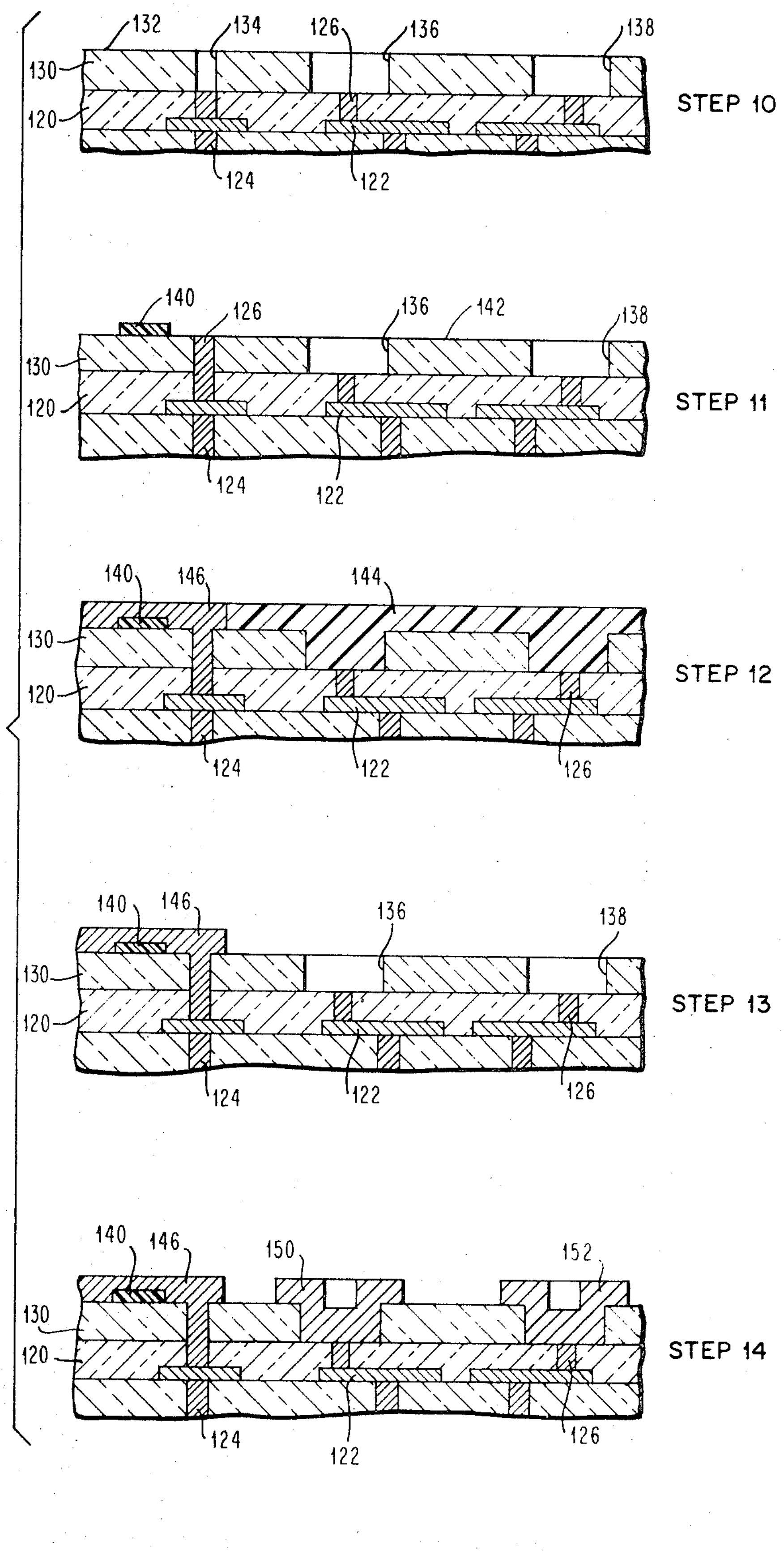

FIGS. 4A and 4B illustrate a preferred process embodiment for fabricating the glass metal module shown generally at 30 in FIGS. 1 and 2.

Step 1

A ceramic body 80 having conductive vias 82 is lapped flat to a predetermined thickness. In the preferred embodiment, the overall thickness of the multi-level ceramic 30, FIGS. 1 and 2, is approximately 78 mils thick, ±3 mils. It is necessary to lap the upper surface 84 to a flatness or planarity within 0.1 or 0.2 mils. Lapping is accomplished with a boron carbide slurry and then the ceramic body is cleaned. At this point in the process, each of the corners is cut at a 45° angle, illustrated in FIG. 1. This plateau formed at each of the corners facilitates orientation of the multi-layer substrate in a four-point location tool. Precise positioning of the substrate is critical, particularly in the later photolithographic operations.

It is essential that the subsequent glass deposition steps at the upper surface 84 be contaminant free. After the lapping operation, a 0.05 percent solution comprising non-ionic detergent in water is employed to scrub the upper surface 84. This step is followed by ultrasonic cleaning and rinsing steps using a cleaning agent, such as isopropanol. The selection of a non-ionic detergent is significant because it is not adsorbed by the ceramic surface, and it is readily removable because of its solubility in the isopropanol rinse.

In the preferred embodiment, the ceramic substrate is essentially an alumina or $AL_2O_3$ composition. However, other compositions such as mullite, berylium oxide, magnesium or other materials having suitable thermal conductivity and dielectric properties can be employed.

Step 2

After conditioning the upper surface of the ceramic body 80, a blanket metallization layer 86 is deposited thereon. The deposition is accomplished by employing four separate sequential metal evaporations comprising chrome-copper-chrome-copper. In the preferred embodiment, the metallization layer 86 comprises a lower chrome layer approximately 800 A thick, an overlying copper layer approximately 80,000 A thick, a top chrome layer approximately 800 A thick, and a top layer of copper approximately 10,000 A thick.

The chrome metal is selected as a bottom layer because of its superior adhesion to both ceramic and glass surfaces. The 80,000 A thick copper layer provides the primary electrical conductive path and its dimensions are mainly dictated by electrical design considerations. Again, the top 800 A thick layer of chrome is selected because of its good adhesion to glass. Finally, the upper top layer of copper is employed in order to provide excellent adhesion qualities for subsequently deposited copper studs. Also, the upper layer of copper protects the underlying chrome layer during a cathode etch operation, hereinafter described in greater detail.

Step 3

This illustrates the results of a selective etching operation. Suitable etchants are selected to provide a personalized metallization pattern comprising a plurality of lines 88. The selective etching operation leaves the metallization lines 88 comprising a chrome-copper-chrome-copper metallurgical system, and only a thin chromium layer 90 in the etched away regions. This thin chromium layer 90 is employed in Step 4 as a cathode for an electroplating process used to deposit copper studs.

Step 4

In order to deposit a conductive stud in the desired locations, a photolithographic or photoresist sheet material 94 is applied over the conductive pattern 88 and the chromium layer 90. Conventional exposure and washing techniques provide openings in the desired locations. Then, using the chrome layer 90 as a cathode, copper studs 96 are plated in the selected openings. After the electroplating operation, the photoresist material 94 and the chrome cathode layer 90 are removed in accordance with well-known techniques.

It is important to maintain uniformity of stud heights 96 in the course of the electroplating process. If the stud heights are below minimum height, it is necessary to remove an excessive amount of glass in a subsequent lapping operation in order to expose the shortest stud. A planar glass surface having the end of each of the studs 96 terminating and exposed in the planar surface is necessary in order to make electrical connection and proceed with further processing, i.e., photoprocessing. The minimum stud height before lapping must be at least as high as the minimum required dielectric layer thickness in order to control desired package impedance.

Step 5

After removing the photoresist layer 94 and the chrome cathode layer 90, and the top copper layer, a glass slurry is deposited on the ceramic substrate 80. The top layer of copper provides a good adhesion surface for the electroplating of the vertical copper studs.

However, in the non-stud areas, the upper copper layer is etched away so as to expose the top chrome layer in order to provide good adhesion for the deposition of its associated overlying glass insulating or dielectric layer. At this stage of the process, the glass layer 98 comprises a glass slurry which can be deposited, for example, by doctor blading or spraying. The slurry is formed of a glass powder having a particle size of 3–5 microns in a suspending medium, such as terpineol. In order to realize the desired physical and dielectric characteristics of the insulating glass layer, it is important to form the glass slurry into a homogenius and uniform dispersion.

In order to produce a bubble-free glass layer, the glass slurry is dried at 125° C for 15–20 minutes to drive off the suspending medium and then fired firstly in a gaseous ambient, such as, hydrogen, that is soluble in the glass layer 98, and then fired in a gaseous ambient, for example, nitrogen or argon, which is insoluble in the glass layer 98.

More specifically, the fired glass slurry or layer 98 is brought to a sintering temperature at which the viscosity of the glass is approximately $10^6$ poise in a hydrogen ambient for a period of time sufficient to allow the glass particles to sinter to a pore-free mass. Then, the hydrogen gaseous ambient is changed to nitrogen, and the sintering temperature is maintained in the nitrogen ambient until sufficient hydrogen has diffused from the glass layer 98 to prevent super-saturation of hydrogen in the glass during subsequent cooling steps. Such super-saturation leads to the nucleation of bubbles in the glass.

Since hydrogen is soluble in the selected glass layer 98, it initially becomes saturated with hydrogen gas. In order to remove the hydrogen gas without creating bubbles in the final or resulting solid glass layer structure, a nitrogen gas, or any other gas having a solubility in the glass significantly lower than hydrogen, is substituted as the gaseous ambient. At this temperature, the hydrogen in the glass layer is exposed to an external gaseous ambient absent hydrogen gas and also possessing significantly lower solubility in the particular glass material selected. As a result, the hydrogen in the glass layer diffuses rapidly out of the glass layer at a very high driving force so as to go into a gas phase above the glass layer surface. The glass layer 98 is thus completely depleted of any hydrogen gas at the selected temperature.

The heat cycling period is not critical, and to a great extent is determined by the furnace limitations. Entire heat cycles of only 20 minutes have produced good results.

The significant factor in the firing step is the temperature. Taking into account the particular characteristics of the glass, it is necessary that the glass be fired in the range of its sintering temperature. If the sintering temperature is significantly exceeded, the glass begins to reflow and reaches an extremely low viscous state. Such a condition is totally unacceptable because during the firing of subsequently deposited layers of glass, complete disruptions of underlying metallized patterns and studs occur. However, the present invention allows the glass to be fired at a high viscosity of sintering state, and thus makes possible the fabrication of a multi-layered package of high bubble-free quality with any desired number of separated metallized planes.

It is intended that the term "glass" be given its broadest possible definition since its particular composition is strictly a matter of choice and design within the spirit of the present invention. In the preferred embodiment CORNING 7070 composition is selected.

In order to prevent each layer of glass from cracking, it is necessary to consider its thermal coefficient of expansion with respect to the underlying ceramic substrate. In the preferred embodiment, the ceramic substrate is essentially or mainly comprised of an alumina, $Al_2O_3$ composition. Accordingly, it is necessary to consider the thermal coefficient of expansion of the selected glass material with respect to the alumina type substrate, because the solid glass layers should be maintained in a state of compression to prevent cracking, particularly when being exposed to continuous thermal heating and cooling cycles. Accordingly, in the preferred embodiment, a glass material having a lower coefficient of thermal expansion than that of its dissimilar supporting ceramic substrate, is selected. Thus, after the initial firing and cooling of the first layer 98, the ceramic substrate is in a state of tension, and the glass layer 98 is in a state of compression. These particular stresses are readily calculable and controllable since basically this stress is related to the thermal excursions of the process and the thickness and size of the materials involved, and therefore, the expansion coefficient of mismatch is fixed by the known properties of the material.

Step 6

After layer 98 is cooled to a solid state, it is necessary to condition the upper surface prior to subsequent steps. As illustrated in Step 6, the layer 98 is lapped to provide an upper planar surface 100. The lapping operation serves three functions. Firstly, it provides a planar surface absolutely necessary for subsequent photolithographic steps. Further, it allows exact thickness control of layer 98 and exposes the studs. In some instances, it has been found that the lapping operation creates sub-microscopic flaws on the upper surface 100.

Therefore, the upper surface may be refired to remove the flaws. Thereafter, in order to insure excellent adhesion of later evaporated films, the upper surface 100 is exposed to a suitable acid, for example, hydrofluoric acid, for a brief period of time. However, it is to be understood that in some instances the sequential steps of the hydrofluoric etching and refiring can be omitted.

Step 7

After conditioning layer 98 to form a suitable upper surface 100, four sequential metal evaporation steps are performed to deposit a blanket layer of metal 102, comprising chrome, copper, chrome, copper. This step is identical with that previously described with respect to Step 2.

Step 8

This illustrates the selective personalization of the second level metallurgy identical to that as previously described in Step 3. The result of this operation leaves a selective metallization pattern indicated at 104 and a chromium cathode layer 106.

Step 9

Thereafter, the identical steps as described in Steps 4 through 6 are performed in order to deposit a second layer of interconnection comprising a second level metallized pattern 104 and second level studs 108, and a second level glass insulation layer 110. After Step 9, the process is repeatable so as to provide any number of desired levels of the metallization.

Metallized patterns 104 comprise a chrome-copper-chrome layer in the non-stud areas. That is, the upper layer of copper protects the upper chrome layer during the etching away of the cathode 106. However, once the cathode 106 is removed, the upper copper layer in the non-stud areas is removed in order to provide a chrome surface possessing superior adhesion qualities to its associated glass layer.

The glass metal package is particularly economical in contrast to other packaging concepts because it is only necessary to fabricate as many multi-levels as is required by the particular system. On the other hand, in other multi-level packaging systems, a minimum number of levels are often necessary due to process constraints regardless of whether that many number of multi-levels are absolutely necessary for the particular electrical system.

It is to be re-emphasized that the novel method of the present invention allows successive layers of glass and metal to be formed without disrupting the lower levels of metallization due to the fact that the firing temperature does not reflow the glass because it is maintained in the sintering temperature range. Further, although the present process and resulting structure are fabricated at a firing temperature which normally would produce a bubbled-defective glass layer, the problem is avoided by virtue of the unique gaseous ambient firing step.

Now referring to FIG. 4B, it illustrates Steps 10 through 14 employed to fabricate the upper surface of the glass-metal package.

Step 10

Step 10 illustrates the next-to-uppermost glass layer 120 having a metallization pattern 122 connected to lower studs 124 and upper studs 126. Again, these elements are fabricated in accordance with the method previously described in Steps 1 through 9.

In addition, a glass-type material having properties different than the underlying glass layers is selected for the topmost glass layer 130. In the preferred embodiment, a solder reflow process is employed to join the semiconductor chips to their top level metallurgy. It was found that in this environment, a top glass layer having the same properties as the underlying glass layers sometimes results in cracking of the uppermost layer. Accordingly, in Step 10, a glass-type layer 130 comprising a quartz material, or other suitable glass-type material having a lower thermal coefficient of expansion than the underlying glass layers, is sputtered or otherwise deposited on the adjacent glass layer 120. The quartz possesses an even lower thermal coefficient of expansion than the underlying glass layers, and thus the upper layer 130 is maintained in an even greater state of compression than that of the underlying glass layers. Conventional quartz sputtering techniques are used to deposit the uppermost layer 130. After the layer 130 is deposited, its upper surface 132 is conditioned to obtain the desired surface qualities and openings 134, 136 and 138 are formed.

Step 11

Next, a metallized vacuum deposition step is performed in order to extend the left-hand upper stud 126 to the surface of the upper quartz layer 130. Also, an engineering change pad 140 is selectively deposited on the upper surface 142. The pad 140 serves as a cushion for subsequent engineering changes once the entire package is chip populated.

Steps 12 and 13

Thereafter, a conventional photoresist mask 144 is deposited on the upper quartz layer 130 in order to selectively expose desired metallization patterns. A metal deposition is then performed to form a selective metallized pattern, a portion of which is illustrated at 146. The resulting structure is illustrated in Step 13. Again, the metallurgy pattern 146 may comprise any suitable system, and in the preferred embodiment, it is constituted by a chrome-copper-chrome-copper combination of metals.

Step 14

Step 14 illustrates the deposition step for providing a pair of chip lands 150 and 152. In the preferred embodiment, the chip lands 150 and 152 each comprise a chrome-copper-gold metallurgical system. Although not shown, well-known solder reflow techniques are then employed to join the chip pads to their respective chip land patterns as illustrated at 150 and 152. Chip bonding using the solder reflow process is illustrated in U.S. Pat. Nos. 3,374,110; 3,429,040; 3,495,133; all to Miller, and assigned to the same assignee as the present invention.

FIG. 5

FIG. 5 illustrates an alternative embodiment for the top level metallurgy previously depicted in Step 14 of FIG. 4B. The top layer of glass 160 contains a plurality of electroplated studs shown at 162. A metallization plane on the next-to-uppermost glass layer comprises chrome-copper-chrome layers 164, 166, and 168 respectively. In this embodiment, a chrome-less delete approach is employed on the uppermost metallization layer.

Firstly, a 1500 A copper layer is blanket evaporated over the upper surface 170 of glass layer 160. Thereafter, an etching operation is performed in order to provide a plurality of islands of copper, one of which is illustrated at 172. Since copper does not adhere to glass as well as chromium, the metallization line is readily severable at this point using a sharp instrument whenever selective disconnection of circuit elements is desired.

Thereafter, a chrome layer followed by a copper layer is blanket deposited over the upper surface. Then, a selective etch operation defines the top surface metallization and chip lands. Chrome layer 173 and copper layer 174 represent metalization layers, and chrome layer 175 and copper layer 176 provide the two bottom-most metallization layer for the chip lands.

Next, a nickel electroplating operation using a photo-resist mask and the chrome cathode (not shown), but previously discussed, deposits nickel layers 178 and 179.

Then, gold layers 182 and 184 are electroplated using the same mask as in the previous step. Then, the resist material and the chrome cathode (not shown) are removed.

Tin-lead layer 187 is sequentially evaporated through a metal mask in the chip pad sites only. Finally, a chip 190 having chip pads is positioned on the chip land sites and bonding is affected using well-known solder reflow techniques.

While the invention has been particularly shown and described with reference to the preferred embodiment thereof, it will be understood by those skilled in the art that the foregoing and other changes in form and details may be made therein without departing from the spirit and scope of the invention.

What is claimed is:

1. A method for fabricating a high performance solid glass-metal electrical interconnection package adaptable for bonding to a plurality of semiconductor integrated circuit chips comprising the steps of:

a. providing a substrate having a plurality of metallized conductive planes,
b. conditioning the upper substrate surface,
c. depositing a first metallized conductive pattern on said upper substrate surface,
d. depositing selectively a plurality of conductive studs on said upper substrate surface,
e. depositing a glass slurry to form a first glass layer over said upper substrate surface,
f. firing said first glass layer at suitable temperatures and gaseous ambient conditions for providing a first bubble-free glass layer,
g. cooling the glass layer and conditioning the first glass layer upper surface,
h. depositing a second conductive metallized pattern on said first glass layer upper surface,
i. selectively depositing a plurality of conductive studs on said first glass layer upper surface,
j. depositing a glass slurry for forming a second glass layer over said first glass layer upper surface,
k. firing and cooling said second glass layer at suitable temperatures and gaseous ambient conditions for forming a bubble-free glass solid mass without disrupting imbedded and underlying metallized conductive patterns and conductive studs.

2. A method for fabricating a high performance solid glass-metal electrical interconnection package adaptable for bonding to a plurality of semiconductor integrated circuit chips as in claim 1 further including the steps of:

a. fabricating as many desired levels or metallized conductive planes by sequentially and successively depositing a metallized conductive pattern on the uppermost glass layer surface by,
   1. depositing conductive studs over the uppermost glass layer surface,
   2. depositing a glass slurry over the uppermost glass layer surface, and then firing, cooling, and conditioning the upper surface of the new resulting uppermost glass layer.

3. A method for fabricating a high performance solid glass-metal electrical interconnection package adaptable for bonding to a plurality of semiconductor integrated circuit chips as in claim 2 further including the steps of:

a. depositing a metallized pattern on the resulting uppermost glass layer surface,
b. bonding a plurality of semiconductor chips to the resulting uppermost glass layer surface metallized pattern.

4. A method for fabricating a high performance solid glass-metal electrical interconnection package adaptable for bonding to a plurality of semiconductor integrated circuit chips as in claim 1 wherein the steps of depositing said first and second metallized conductive patterns and said plurality of conductive studs on said substrate and said first glass layer further comprise the steps of:

a. depositing a plurality of overlying metal layers for forming said metallized conductive patterns and selecting the uppermost layer for providing a superior bonding surface for said studs and the next-to-uppermost layer for providing superior adhesion properties to the selected glass composition,
b. selectively removing layers of said metallized conductive pattern for defining an electroplating terminal and an electrical interconnection-path,
c. electroplating said conductive studs on said uppermost metal layer using said electroplating terminal,
d. removing said electroplating terminal, and
e. removing selectively the uppermost layer of said metal for exposing the next-to-uppermost layer having good adhesion properties to glass.

5. A method for fabricating a high performance solid glass-metal electrical interconnection package adaptable for bonding to a plurality of semiconductor integrated circuit chips comprising the steps of claim 1 wherein the step of conditioning the first glass layer upper surface further includes the step of:

a. removing excessive glass material to a predetermined first glass layer thickness for providing a planar glass layer surface with the exposed stud ends residing in the same plane, and for providing desired dielectric impedance value.

6. A method for fabricating a high performance solid glass-metal electrical interconnection package adaptable for bonding to a plurality of semiconductor integrated circuit chips as in claim 4 wherein the step of depositing a plurality of overlying metal layer includes the step of:

a. sequentially depositing chrome, copper, chrome, and copper metal layers.

7. A method for fabricating a high performance solid glass-metal electrical interconnection package adaptable for bonding to a plurality of semiconductor integrated circuit chips as in claim 1 wherein the step of providing a substrate further includes the step of:

a. selecting a substrate of dissimilar refractory material, having a thermal coefficient of expansion higher than that of said first and second layers of glass.

* * * * *